(12) United States Patent
Chen et al.

(10) Patent No.: US 12,702,051 B2
(45) Date of Patent: Aug. 4, 2026

(54) INTEGRATED CIRCUIT PACKAGES AND METHODS

(71) Applicant: Taiwan Semiconductor Manufacturing Co., Ltd., Hsinchu (TW)

(72) Inventors: Yi-Hsiu Chen, Hsinchu (TW); Chia-Fang Tsai, Hsinchu (TW); Ming-Yun Liao, Taoyuan City (TW); Yu-Chian Chiang, Kaohsiung City (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 404 days.

(21) Appl. No.: 18/401,862

(22) Filed: Jan. 2, 2024

(65) Prior Publication Data

US 2025/0087543 A1 Mar. 13, 2025

Related U.S. Application Data

(60) Provisional application No. 63/608,681, filed on Dec. 11, 2023, provisional application No. 63/581,808, filed on Sep. 11, 2023.

(51) Int. Cl.
*H10W 90/00* (2026.01)
*H10W 74/01* (2026.01)
(Continued)

(52) U.S. Cl.
CPC ....... *H10W 74/121* (2026.01); *H10W 72/942* (2026.01); *H10W 74/014* (2026.01);
(Continued)

(58) Field of Classification Search
CPC . H10W 74/019; H10W 74/014; H10W 74/15; H10W 74/121; H10W 72/01931; H10W 72/29; H10W 72/923; H10W 72/941; H10W 72/944; H10W 72/951; H10W 72/952; H10W 72/963; H10W 72/967; H10W 90/00; H10W 90/722;
(Continued)

(56) References Cited

U.S. PATENT DOCUMENTS 8,993,380 B2 3/2015 Hou et al.
9,281,254 B2 3/2016 Yu et al.
(Continued)

FOREIGN PATENT DOCUMENTS

TW 202209517 A 3/2022
TW 202232613 A 8/2022

*Primary Examiner* — Monica D Harrison
(74) *Attorney, Agent, or Firm* — Slater Matsil, LLP

(57) ABSTRACT

An integrated circuit package and the method of forming the same are provided. The integrated circuit package may include a first die having a first substrate and a first through via extending through the first substrate, a first gap-fill layer along a sidewall of the first substrate, an isolation layer on a surface of the first substrate and a surface of the first gap-fill layer, a first bonding layer over the isolation layer, and a first bonding pad in the first bonding layer. The isolation layer may overlap an interface between the side-wall of the first substrate and a sidewall of the first gap-fill layer, and may extend on sidewalls of the first through via.

20 Claims, 17 Drawing Sheets

(51) Int. Cl.

| | |
|---|---|
| *H10W 74/10* | (2026.01) |
| *H10W 72/00* | (2026.01) |
| *H10W 72/20* | (2026.01) |
| *H10W 72/29* | (2026.01) |
| *H10W 72/90* | (2026.01) |
| *H10W 74/15* | (2026.01) |
| *H10W 80/00* | (2026.01) |

(52) U.S. Cl.
CPC ......... *H10W 74/019* (2026.01); *H10W 90/00* (2026.01); *H10W 72/01931* (2026.01); *H10W 72/01935* (2026.01); *H10W 72/01938* (2026.01); *H10W 72/252* (2026.01); *H10W 72/29* (2026.01); *H10W 72/923* (2026.01); *H10W 72/941* (2026.01); *H10W 72/9413* (2026.01); *H10W 72/944* (2026.01); *H10W 72/951* (2026.01); *H10W 72/952* (2026.01); *H10W 72/963* (2026.01); *H10W 72/967* (2026.01); *H10W 74/15* (2026.01); *H10W 80/211* (2026.01); *H10W 80/327* (2026.01); *H10W 90/722* (2026.01); *H10W 90/724* (2026.01); *H10W 90/732* (2026.01); *H10W 90/734* (2026.01); *H10W 90/792* (2026.01)

(58) Field of Classification Search
CPC ............. H10W 90/732; H10W 90/734; H10W 90/792; H10W 72/01935; H10W 72/01938; H10W 72/252; H10W 72/9413; H10W 72/942; H10W 80/211; H10W 80/327; H10W 90/724; H10W 90/297; H10W 70/05; H10W 70/095; H10W 70/611; H10W 70/635; H10W 70/65; H10W 70/685
USPC ......................................................... 257/621
See application file for complete search history.

(56) References Cited

U.S. PATENT DOCUMENTS

| | | | |
|---|---|---|---|
| 9,299,649 | B2 | 3/2016 | Chiu et al. |
| 9,372,206 | B2 | 6/2016 | Wu et al. |
| 9,425,126 | B2 | 8/2016 | Kuo et al. |
| 9,443,783 | B2 | 9/2016 | Lin et al. |
| 9,461,018 | B1 | 10/2016 | Tsai et al. |
| 9,496,189 | B2 | 11/2016 | Yu et al. |
| 9,666,502 | B2 | 5/2017 | Chen et al. |
| 9,735,131 | B2 | 8/2017 | Su et al. |
| 11,721,666 | B2 * | 8/2023 | Chung .................. H10W 20/20 257/621 |
| 2022/0262768 | A1 | 8/2022 | Chen et al. |
| 2022/0384374 | A1 | 12/2022 | Yu et al. |
| 2023/0268300 | A1 | 8/2023 | Uzoh et al. |
| 2025/0233115 | A1 * | 7/2025 | Yu .......................... H10W 74/01 |

* cited by examiner

INTEGRATED CIRCUIT PACKAGES AND METHODS

PRIORITY CLAIM AND CROSS-REFERENCE

This application claims the benefit of U.S. Provisional Application No. 63/581,808, filed on Sep. 11, 2023, and the benefit of U.S. Provisional Application No. 63/608,681, filed on Dec. 11, 2023, which are hereby incorporated herein by reference.

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area. As the demand for shrinking electronic devices has grown, a need for smaller and more creative packaging techniques of semiconductor dies has emerged.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
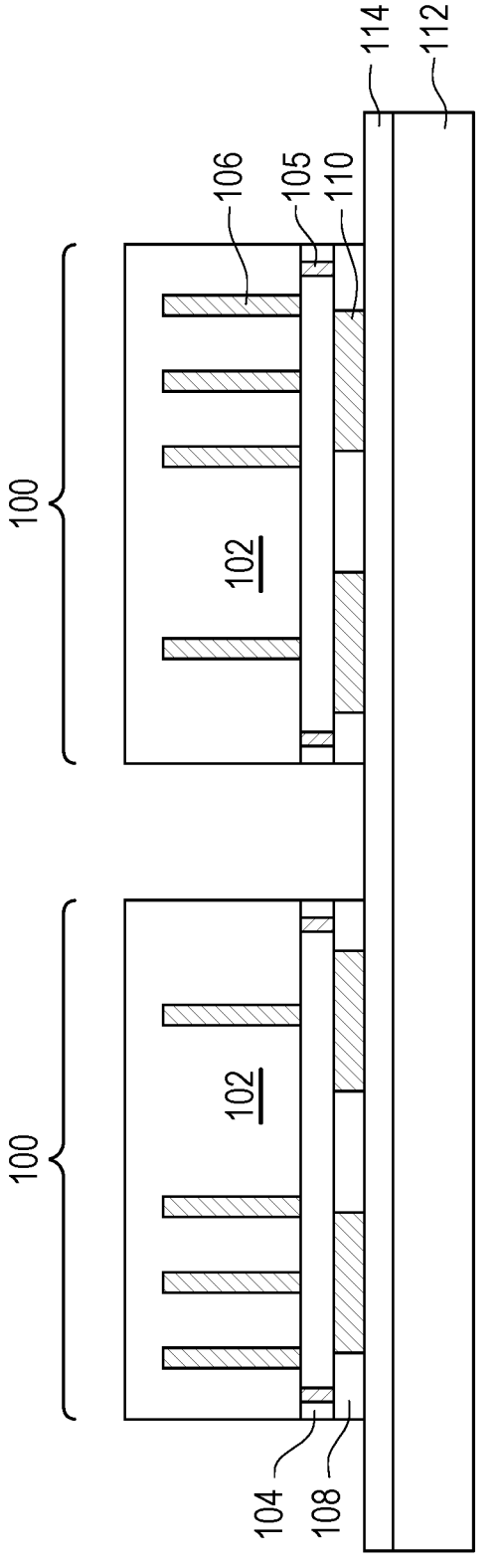
FIGS. 1, 2, 3, 4, 5, 6, 7, 8, 9, 10, 11, 12, 13, 14A, 14B, 15A, and 15B illustrate cross-sectional views and top-down views of intermediate stages in the formation of an integrated circuit package, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

An integrated circuit package with an isolation layer over interfaces between a semiconductor device and an encapsulant, and a method of forming the same are provided. In accordance with some embodiments, one or more lower integrated circuit dies may be encapsulated in a lower gap-fill layer, and an isolation layer may be formed on surfaces of the lower gap-fill layer and the lower integrated circuit dies. The isolation layer may be over interfaces between the lower integrated circuit dies and the lower gap-fill layer. A bonding layer may be formed on the isolation layer and bonding pads may be formed in the bonding layer. One or more upper integrated circuit dies may be bonded to the bonding layer and the bonding pads, wherein the upper integrated circuit dies may be directly over interfaces between the lower integrated circuit dies and the lower gap-fill layer. By forming the isolation layer directly over interfaces between the lower integrated circuit dies and the lower gap-fill layer, the effect of the coefficient of thermal expansion (CTE) mismatch between the lower integrated circuit dies and the lower gap-fill layer on the bonding integrity between the upper integrated circuit dies and the bonding layer as well as the bonding pads may be eliminated or reduced, thereby eliminating or reducing the risk of the delamination of the upper integrated circuit dies during the manufacturing and the operation of the integrated circuit package. As a result, better reliability of the integrated circuit package may be achieved.

FIGS. 1-13 illustrate intermediate processing steps in forming an integrated circuit package. Referring first to FIG. 1, lower integrated circuit dies 100 are attached to a carrier 112 by an adhesive 114. The carrier 112 may be a semiconductor carrier, a glass carrier, a ceramic carrier, or the like. The carrier 112 may be a wafer. In some embodiments, the adhesive 114 is a thermal-release layer, such as an epoxy-based light-to-heat-conversion (LTHC) release material, which loses its adhesive property when heated. In some embodiments, the adhesive 114 is a UV glue, which loses its adhesive property when exposed to UV light. The layout of the lower integrated circuit dies 100 over the carrier 112 shown in FIG. 1 is an example, and other layouts are contemplated.

Each lower integrated circuit die 100 may be a logic die (e.g., central processing unit (CPU), graphics processing unit (GPU), system-on-a-chip (SoC), application processor (AP), microcontroller, etc.), a memory die (e.g., dynamic random access memory (DRAM) die, static random access memory (SRAM) die, etc.), a power management die (e.g., power management integrated circuit (PMIC) die), a radio frequency (RF) die, a sensor die, a micro-electro-mechanical-system (MEMS) die, a signal processing die (e.g., digital signal processing (DSP) die), a front-end die (e.g., analog front-end (AFE) die), the like, or combinations thereof.

Each lower integrated circuit die 100 may have a semiconductor substrate 102, such as silicon, doped or undoped, or an active layer of a semiconductor-on-insulator (SOI) substrate. The semiconductor substrate 102 may include other semiconductor materials, such as germanium, silicon carbide, gallium arsenic, gallium phosphide, indium phosphide, indium arsenide, indium antimonide, SiGe, GaAsP, AlInAs, AlGaAs, GaInAs, GaInP, and/or GaInAsP, or combinations thereof. Other substrates, such as multi-layered or gradient substrates, may also be used. The semiconductor substrate 102 may have an active surface (e.g., the surface facing downwards in FIG. 1), which may be called a front side, and an inactive surface (e.g., the surface facing upwards in FIG. 1), which may be called a back side. The back side of the semiconductor substrate 102 may also be referred to as a back side of the lower integrated circuit die 100 and the front side of the semiconductor substrate 102 may face a front side of the lower integrated circuit die 100.

Devices (not separately illustrated) may be disposed at the active surface of the semiconductor substrate 102. The devices may be active devices (e.g., transistors, diodes, etc.), capacitors, resistors, or the like. An interconnect structure 104 may be disposed on the active surface of the semiconductor substrate 102. The interconnect structure 104 may interconnect the devices to form an integrated circuit. The interconnect structure 104 may comprise metallization patterns (not separately shown) in dielectric layers (not separately shown). The dielectric layers may be low-k dielectric layers. The metallization patterns may include metal lines and vias, which may be formed in the dielectric layers by a damascene process, such as a single damascene process, a dual damascene process, or the like. The metallization patterns may be formed of a suitable conductive material, such as copper, tungsten, aluminum, silver, gold, a combination thereof, or the like. The metallization patterns may be electrically coupled to the devices. A seal ring 105 may extend through the interconnect structure 104 of each lower integrated circuit die 100. The seal ring 105 may encircle the metallization patterns of the corresponding interconnect structure 104 in a top-down view and a region between the seal ring 105 and the metallization patterns may be referred to as a keep-out zone (KOZ). The seal ring 105 may be formed of the same or similar material and by the same or similar process as the metallization patterns. The seal ring 105 may be electrically isolated from the devices.

Conductive vias 106 may be disposed in the semiconductor substrate 102. The conductive vias 106 may be electrically coupled to the metallization patterns of the interconnect structure 104. The semiconductor substrate 102 may be thinned in a subsequent process to expose the conductive vias 106 at the inactive surface of the semiconductor substrate 102. After the thinning process, the conductive vias 106 may be through-substrate vias (TSV), such as through-silicon vias. In some embodiments, the conductive vias 106 are formed by a via-first process, such that the conductive vias 106 may extend into the semiconductor substrate 102 but not into the interconnect structure 104. The conductive vias 106 formed by a via-first process may be connected to a lower metallization pattern (e.g., closer to the semiconductor substrate 102) of the interconnect structure 104. In some embodiments, the conductive vias 106 are formed by a via-middle process, such that the conductive vias 106 may extend through a portion of the interconnect structure 104 and into the semiconductor substrate 102. The conductive vias 106 formed by a via-middle process may be connected to a middle metallization pattern of the interconnect structure 104. In some embodiments, the conductive vias 106 are formed by a via-last process, such that the conductive vias 106 may extend through an entirety of the interconnect structure 104 and into the semiconductor substrate 102. The conductive vias 106 formed by a via-last process may be connected to an upper metallization pattern (e.g., further from the semiconductor substrate 102) of the interconnect structure 104.

A bonding layer 108 may be disposed on the interconnect structure 104 at the front side of each lower integrated circuit die 100. The bonding layer 108 may be formed of an oxide such as silicon oxide, phosphosilicate glass (PSG), borosilicate glass (BSG), boron-doped phosphosilicate glass (BPSG), a tetraethyl orthosilicate (TEOS) based oxide, or the like; a nitride such as silicon nitride or the like; or the like. The bonding layer 108 may be formed by chemical vapor deposition (CVD), atomic layer deposition (ALD), or the like. One or more passivation layer(s) (not separately illustrated) may be disposed between the bonding layer 108 and the interconnect structure 104.

Bonding pads 110 may extend through the bonding layer 108 and be electrically coupled to metallization patterns of the interconnect structure 104. The bonding pads 110 may include conductive pillars, conductive pads, or the like, to which external connections can be made. In some embodiments, the bonding pads 110 include conductive pads at the front side of the lower integrated circuit die 100 and conductive vias that connect the conductive pads to the upper metallization pattern of the interconnect structure 104. In such embodiments, the bonding pads 110, including the conductive pads and the conductive vias, may be formed by a damascene process, such as a single damascene process, a dual damascene process, or the like. The bonding pads 110 may be formed of a conductive material, such as copper, aluminum, or the like, by a suitable coating process, such as plating or the like.

Figure 2:
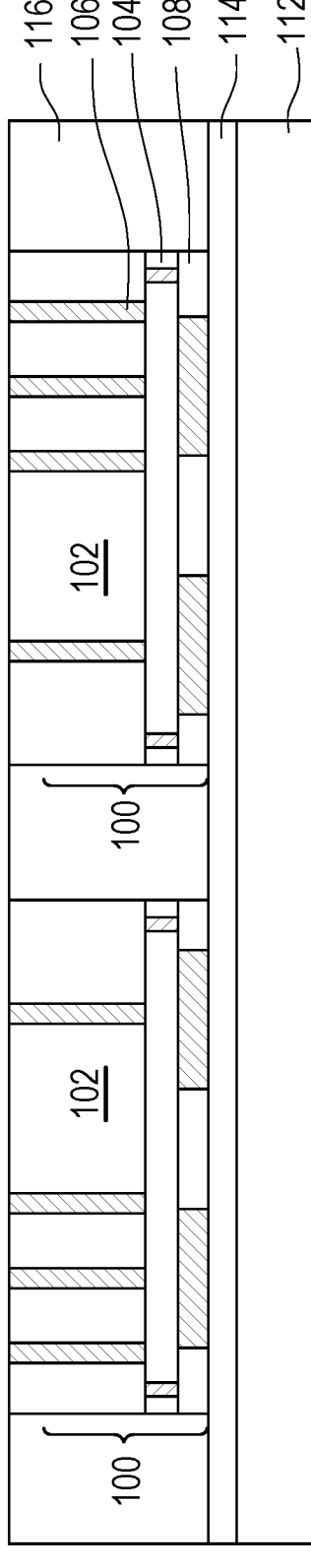

In FIG. 2, a lower gap-fill layer 116 is formed around the lower integrated circuit dies 100 and the semiconductor substrates 102 of the lower integrated circuit dies 100 are thinned to expose the conductive vias 106. The lower gap-fill layer 116 may encircle the lower integrated circuit dies 100 in the top-down view. The lower gap-fill layer 116 may extend along sidewalls of the lower integrated circuit dies 100 (including the semiconductor substrates 102, the interconnect structure 104, and the bonding layer 108). The lower gap-fill layer 116 may have a different CTE from components of the lower integrated circuit dies 100 (e.g., the semiconductor substrates 102). The lower gap-fill layer 116 may be an insulating layer and may be formed of a dielectric material, such as silicon oxide, PSG, BSG, BPSG, a TEOS based oxide, polymer, or the like, which may be formed by a suitable deposition process such as CVD, ALD, spin-coating, or the like. Initially, the lower gap-fill layer 116 may cover the back sides of the lower integrated circuit dies 100.

One or more thinning processes may be performed to level top surfaces of the lower gap-fill layer 116 with top surfaces of the lower integrated circuit dies 100 and to expose top surfaces the conductive vias 106. The one or more thinning processes may be a chemical-mechanical polishing (CMP) process, a grinding process, an etch-back process, combinations thereof, or the like, which is performed at the back sides of the lower integrated circuit dies 100. After the one or more thinning processes, the top surfaces of the lower gap-fill layer 116, the lower integrated circuit dies 100 (including the semiconductor substrates 102 and the conductive vias 106) may be substantially coplanar or level (within process variations).

Figure 3:
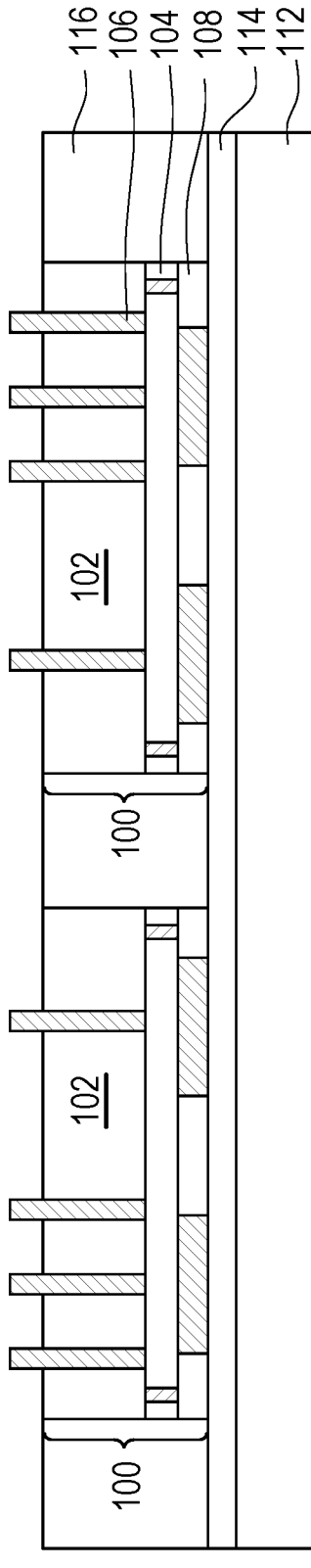

In FIG. 3, portions of the semiconductor substrates 102 and the lower gap-fill layer 116 are further removed to expose sidewalls of the conductive vias 106. The removal process may be an etching process, such as a dry etching process, which selectively removes the semiconductor substrates 102 and the lower gap-fill layer 116 while leaving the conductive vias 106 substantially intact. In some embodiments, a removal rate of the semiconductor substrates 102 is similar to a removal rate of the lower gap-fill layer 116, and after the removal process, the top surfaces of the lower gap-fill layer 116 and the semiconductor substrates 102 are substantially coplanar or level (within process variations).

Figure 4:
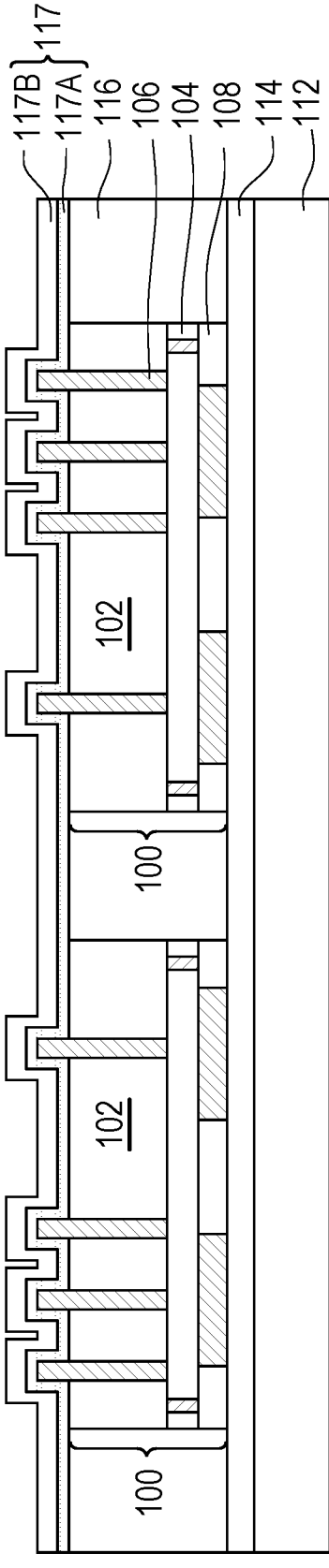

In FIG. 4, an isolation layer 117 is formed on the lower gap-fill layer 116, the lower integrated circuit dies 100, and the conductive vias 106. The isolation layer 117 may isolate each of the conductive vias 106 from neighboring conductive vias 106 to prevent current leakage. The isolation layer 117 may be formed as a conformal layer, which is in contact with the sidewalls of the conductive vias 106, as well as the top surfaces of the lower gap-fill layer 116, the semiconductor substrates 102, and the conductive vias 106. The isolation layer 117 may overlap interfaces between the lower integrated circuit dies 100 (including the semiconductor substrates 102) and the lower gap-fill layer 116, such as the sidewalls of the semiconductor substrates 102 and sidewalls of the lower gap-fill layer 116. As discussed in greater details below, forming the isolation layer 117 directly over the interfaces between the lower integrated circuit dies 100 and the lower gap-fill layer 116 may eliminate or reduce the effect of the CTE mismatch between the materials underneath, such as between the components of the lower integrated circuit dies 100 (e.g., the semiconductor substrates 102) and the lower gap-fill layer 116, on the bonding integrity between a bonding layer which is subsequently formed on the isolation layer 117 and upper integrated circuit dies which are subsequently bonded to the bonding layer.

The isolation layer 117 may be formed of one or more dielectric materials with high Young's moduli and by one or more suitable deposition processes such as CVD, ALD, or the like. In some embodiments, the isolation layer 117 comprises a first sublayer 117A formed on the lower gap-fill layer 116, the lower integrated circuit dies 100, and the conductive vias 106, and a second sublayer 117B formed on the first sublayer 117A. In such embodiments, the first sublayer 117A and the second sublayer 117B may comprise different materials. For example, the first sublayer 117A may comprise silicon nitride, silicon carbide, or the like, and the second sublayer 117B may comprise silicon oxide or the like. In some embodiments, the isolation layer 117 comprises a single material, such as silicon nitride or the like.

Figure 5:
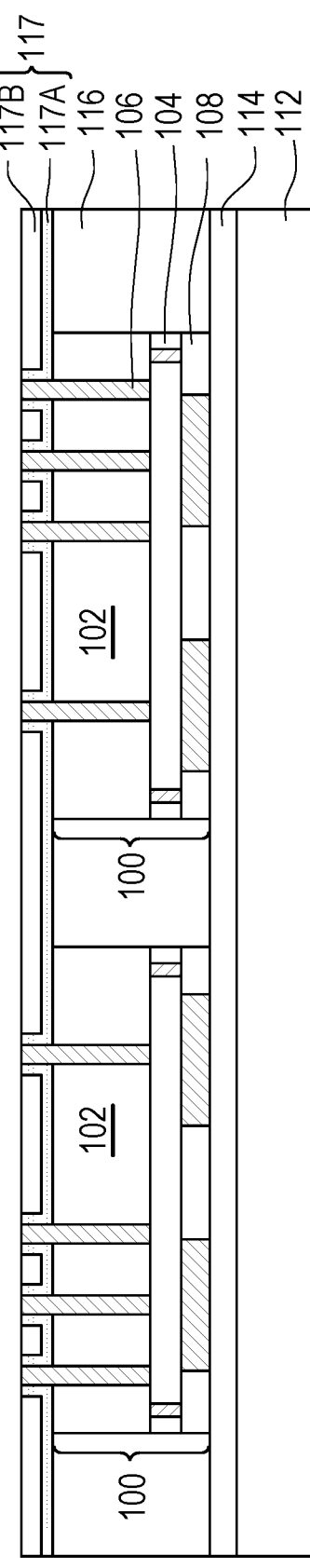

In FIG. 5, portions of the isolation layer 117 are removed to re-expose the top surfaces of the conductive vias 106. Portions of the conductive vias 106 may also be removed. The removal process may be, a CMP process, a grinding process, an etch-back process, combinations thereof, or the like. After the removal process, top surfaces of the isolation layer 117 and the conductive vias 106 may be substantially coplanar or level (within process variations). Portions of the isolation layer 117 may extend continuously from the sidewall of the conductive via 106 of one lower integrated circuit die 100 to the sidewall of the conductive via 106 of another lower integrated circuit die 100. In the embodiments where the isolation layer 117 comprises the first sublayer 117A and the second sublayer 117B, the first sublayer 117A becomes U-shaped after the removal process and extends between the sidewalls of neighboring conductive vias 106 of the same lower integrated circuit die 100 or neighboring integrated circuit dies 100 as shown in the cross-sectional view of FIG. 5. The top surfaces of the first sublayer 117A, the second sublayer 117B, and the conductive vias 106 are substantially coplanar or level (within process variations).

Figure 6:
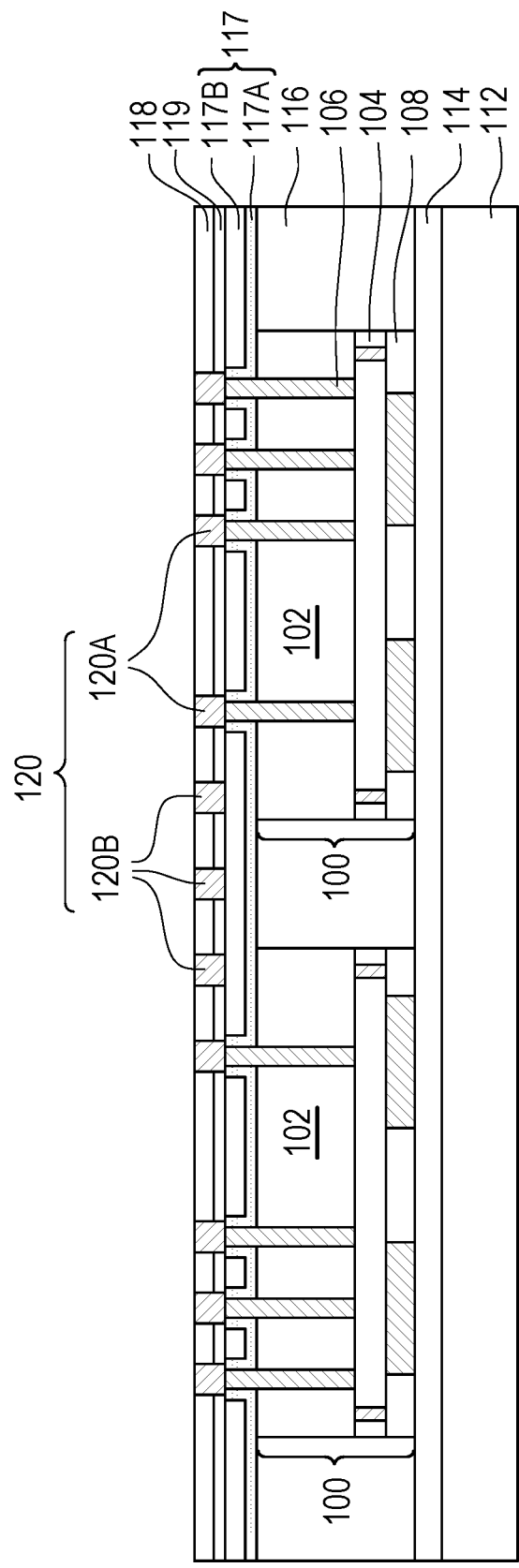

In FIG. 6, an etch stop layer 119 is formed on the isolation layer 117 and the conductive vias 106, a bonding layer 118 is formed on the etch stop layer 119, and bonding pads 120 are formed in the bonding layer 118 and the etch stop layer 119. The etch stop layer 119 may protect the underlying conductive vias 106 during the formation of the bonding pads 120. The bonding pads 120 may be used for bonding with the upper integrated circuit dies in a subsequent process. The bonding pads 120 may extend through the bonding layer 118 and the etch stop layer 119. In some embodiments, the bonding layer 118 is directly formed on the isolation layer 117 and the conductive vias 106, and the bonding pads 120 are formed in the bonding layer 118.

The bonding pads 120 may comprise active bonding pads 120A and dummy bonding pads 120B. The active bonding pads 120A may be the bonding pads 120 that are electrically coupled with circuitry, such as the circuitry of the lower integrated circuit dies 100. The active bonding pads 120A may be in contact with the conductive vias 106 and the isolation layer 117. The isolation layer 117 may be between the active bonding pads 120A and the semiconductor substrates 102. The dummy bonding pads 120B may be the bonding pads 120 that are electrically isolated from circuitry, such as the circuitry of the lower integrated circuit dies 100. The dummy bonding pads 120B may be in contact with the isolation layer 117 and bottom surfaces of the dummy bonding pads 120B may be covered by the isolation layer 117. The dummy bonding pads 120B may be directly over the lower gap-fill layer 116 and the semiconductor substrates 102, and may be separated from the lower gap-fill layer 116 and the semiconductor substrates 102 by the isolation layer 117.

The etch stop layer 119 may be formed of a dielectric material, such as silicon nitride, silicon carbide, or the like, which may be formed by a suitable deposition process such as CVD, ALD, or the like. The bonding layer 118 may be formed of an oxide, such as silicon oxide, PSG, BSG, BPSG, a TEOS based oxide, titanium oxide, or the like; or a nitride, such as silicon nitride, silicon oxynitride, silicon carbonitride, aluminum nitride, which may be formed by a suitable deposition process such as CVD, ALD, or the like. The bonding pads 120 may be formed by a damascene process, such as a single damascene process, a dual damascene process, or the like. The bonding pads 120 may be formed of a metal, such as copper, aluminum, or the like, which can be formed by plating or the like. In some embodiments, a planarization process such as a CMP process, a grinding process, an etch-back process, combinations thereof, or the like, is performed on the bonding layer 118 and the bonding pads 120. After the planarization process, top surfaces of the bonding layer 118 and the bonding pads 120 may be substantially coplanar or level (within process variations).

Figure 7:
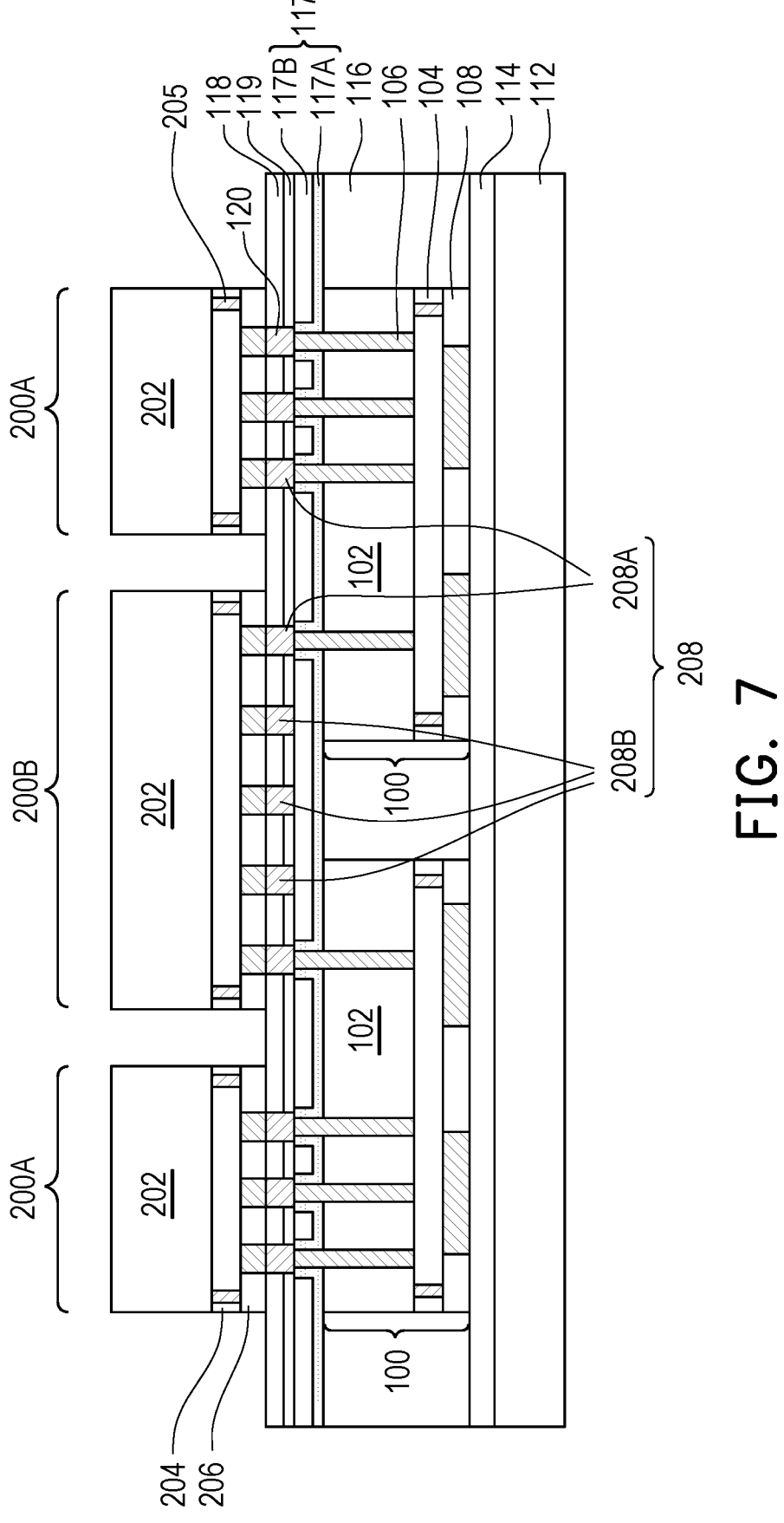

In FIG. 7, one or more upper integrated circuit dies 200 are bonded to the bonding layer 118 and the bonding pads 120. The upper integrated circuit dies 200 may overlap lower integrated circuit dies 100. For example, FIG. 7 illustrates embodiments in which the upper integrated circuit dies 200A overlap one lower integrated circuit die 100 and the upper integrated circuit die 200B overlaps two lower integrated circuit dies 100. The upper integrated circuit die 200B also overlaps the interfaces between the lower integrated circuit dies 100 (including the semiconductor substrates 102) and the lower gap-fill layer 116. Each of the two upper integrated circuit dies 200A may be electrically coupled to the corresponding lower integrated circuit dies 100 underneath. The upper integrated circuit die 200B may be electrically coupled to both of the lower integrated circuit dies 100. As a result, the lower integrated circuit dies 100 may be electrically coupled to each other by the upper integrated circuit die 200B. In some embodiments, the upper integrated circuit die 200B does not comprise any active devices and thus may be referred to as a bridge die or silicon bridge. In some embodiments, the upper integrated circuit die 200B comprises active devices may be referred to as an active integrated circuit die. The layout of the upper integrated circuit dies 200 on the bonding layer 118 shown in FIG. 7 is an example, and other layouts are contemplated.

Each upper integrated circuit die 200 may be a logic die (e.g., CPU, GPU, SoC, AP, microcontroller, etc.), a memory die (e.g., DRAM die, SRAM die, etc.), a power management die (e.g., PMIC die), a RF die, a sensor die, a MEMS die, a signal processing die (e.g., DSP die), a front-end die (e.g., AFE die), the like, or combinations thereof. The materials and manufacturing processes of the features in the upper integrated circuit dies 200 may be found by referring to the like features in the lower integrated circuit die 100. Each upper integrated circuit die 200 may include a semiconductor substrate 202, which may have an active surface (e.g., the surface facing downwards in FIG. 7), which may be called a front side, and an inactive surface (e.g., the surface facing upwards in FIG. 7), which may be called a back side. The back side of the semiconductor substrate 202 may also be referred to as a back side of the upper integrated circuit die 200 and the front side of the semiconductor substrate 202 may face a front side of the upper integrated circuit die 200.

Devices (not separately illustrated) may be disposed at the active surface of the semiconductor substrate 202. The devices may be active devices (e.g., transistors, diodes, etc.), capacitors, resistors, or the like. An interconnect structure 204 may be disposed on the active surface of the semiconductor substrate 202. The interconnect structure 204 may interconnect the devices to form an integrated circuit. The interconnect structure 204 may comprise metallization patterns (not separately shown) in dielectric layers (not separately shown). The metallization patterns may be electrically coupled to the devices. A bonding layer 206 may be disposed on the interconnect structure 204, at the front side of the upper integrated circuit die 200. One or more passivation layer(s) (not separately illustrated) may be disposed between the bonding layer 206 and the interconnect structure 204. The bonding layer 206 may comprise same or similar materials to the bonding layer 118.

Bonding pads 208 may extend through the bonding layer 206 may be electrically coupled to the metallization patterns of the interconnect structure 204. The bonding pads 208 may comprise active bonding pads 208A and dummy bonding pads 208B. The active bonding pads 208A may be the bonding pads 208 that are in contact with the active bonding pads 120A (shown in FIG. 6). The dummy bonding pads 208B may be the bonding pads 120 that are in contact with the dummy bonding pads 120B (shown in FIG. 6). The active bonding pads 120A and active bonding pads 208A may be electrically coupled to the circuitry of the lower integrated circuit dies 100 and/or circuitry of the upper integrated circuit dies 200. The dummy bonding pads 120B and dummy bonding pads 208B may be electrically isolated from the circuitry of the lower integrated circuit dies 100 and the circuitry of the upper integrated circuit dies 200. The bonding pads 208 may comprise same or similar materials to the bonding pads 120.

A seal ring 205 may extend through the interconnect structure 204 of each upper integrated circuit die 200. The seal ring 205 may encircle the metallization patterns of the corresponding interconnect structure 204 in the top-down view and a region between the seal ring 205 and the metallization patterns may be referred to as the KOZ. The seal ring 205 may be formed of the same or similar material and by the same or similar process as the metallization patterns. The seal ring 205 may be electrically isolated from the devices.

The upper integrated circuit dies 200 may be bonded to the bonding layer 118 and the bonding pads 120 by placing the upper integrated circuit dies 200 using a pick-and-place process or the like, then bonding the upper integrated circuit dies 200 to the bonding layer 118 and the bonding pads 120. The bonding layers 206 of the upper integrated circuit dies 200 may be directly bonded to the bonding layer 118 through dielectric-to-dielectric bonding, and the bonding pads 208 of the upper integrated circuit dies 200 may be directly bonded to respective bonding pads 120 through metal-to-metal bonding. In the embodiments illustrated in FIG. 7, the size and shape of the bonding pads 208 are the same or similar to the respective bonding pads 120. In other embodiments, the size (e.g., width) of the bonding pads 208 is smaller than the respective bonding pads 120.

The bonding may include a pre-bonding and an annealing. During the pre-bonding, a small pressing force may be applied to press the upper integrated circuit dies 200 against the bonding layer 118 and the bonding pads 120. The pre-bonding may be performed at a low temperature, such as room temperature. After the pre-bonding, direct bonds such as dielectric-to-dielectric bonds may be formed between the bonding layers 206 and the bonding layer 118. The bonding strength between the bonding layers 206 and the bonding layer 118 may be then improved in a subsequent annealing step at a higher temperature. The bonding pads 208 may be in contact with the bonding pads 120 after the pre-bonding, or may expand to be brought into contact with the bonding pads 120 during the annealing. Further, during the annealing, the material of the bonding pads 208 may intermingle or bond with the material of the bonding pads 120, so that metal-to-metal bonds may be formed.

The isolation layer 117 directly over the interfaces between the lower integrated circuit dies 100 and the lower gap-fill layer 116 may eliminate or reduce the effect of the CTE mismatch between the materials underneath, such as components of the lower integrated circuit dies 100 (e.g., the semiconductor substrates 102) and the lower gap-fill layer 116 on the bonding integrity between the upper integrated circuit dies 200 and the bonding layer 118 as well as the bonding pads 120, thereby eliminating or reducing the risk of the delamination of the upper integrated circuit dies 200 during the manufacturing and the operation of the integrated circuit package. As a result, better reliability of the integrated circuit package may be achieved.

FIG. 7 illustrates a front-to-back bonding configuration as an example, wherein the back sides of the lower integrated circuit dies 100 face the front sides of the upper integrated circuit dies 200 after bonding. Other bonding configurations may be used, such as a front-to-front bonding configuration or other bonding configuration. In the front-to-front bonding configuration the front sides of lower integrated circuit die 100.

Figure 8:
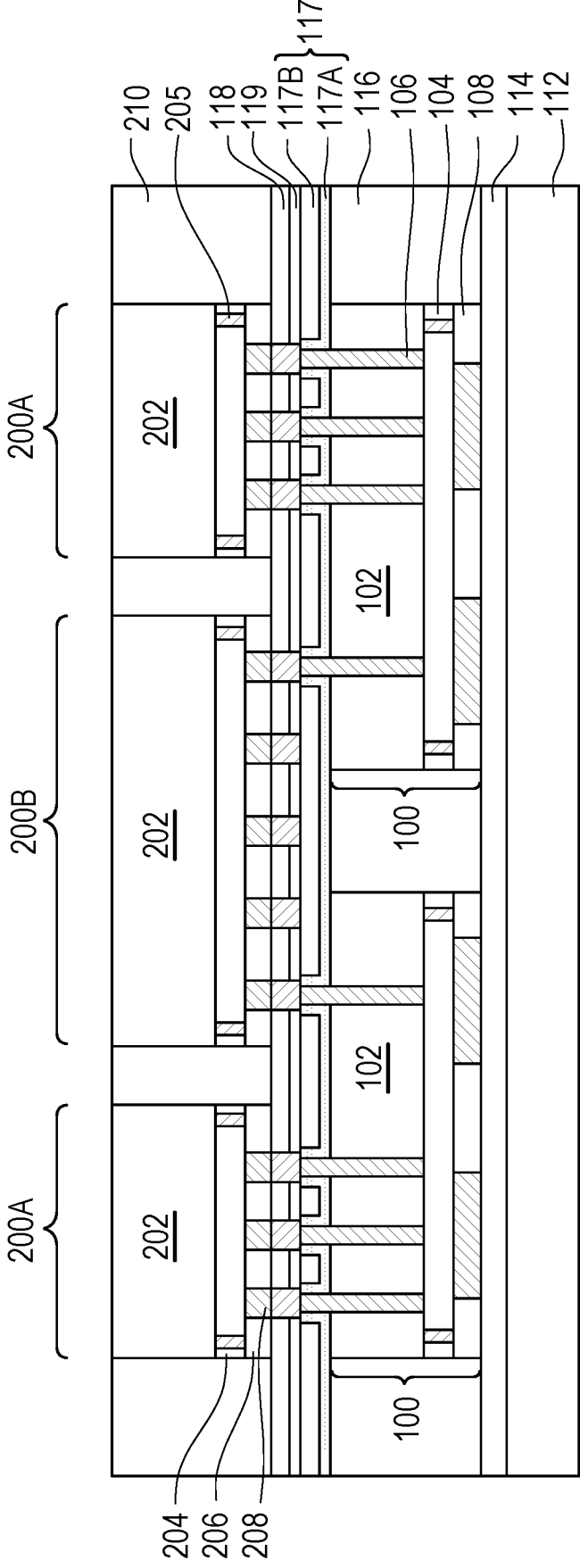

In FIG. 8, an upper gap-fill layer 210 is formed around the upper integrated circuit dies 200. The upper gap-fill layer 210 may encircle the upper integrated circuit dies 200 in the top-down view. The upper gap-fill layer 210 may extend along sidewalls of the upper integrated circuit dies 200 (including the semiconductor substrates 202, the interconnect structure 204, and the bonding layer 206). The upper gap-fill layer 210 may be formed by the same or similar method and formed of the same or similar dielectric material as the lower gap-fill layer 116. A thinning process may be performed to remove portions of the back sides of the semiconductor substrates 202 and the upper gap-fill layer 210. The thinning process may be, a CMP process, a grinding process, an etch-back process, combinations thereof, or the like. After the thinning process, top surfaces of the upper gap-fill layer 210, and the upper integrated circuit dies 200 (including the semiconductor substrates 202) may be substantially coplanar or level (within process variations).

Figure 9:
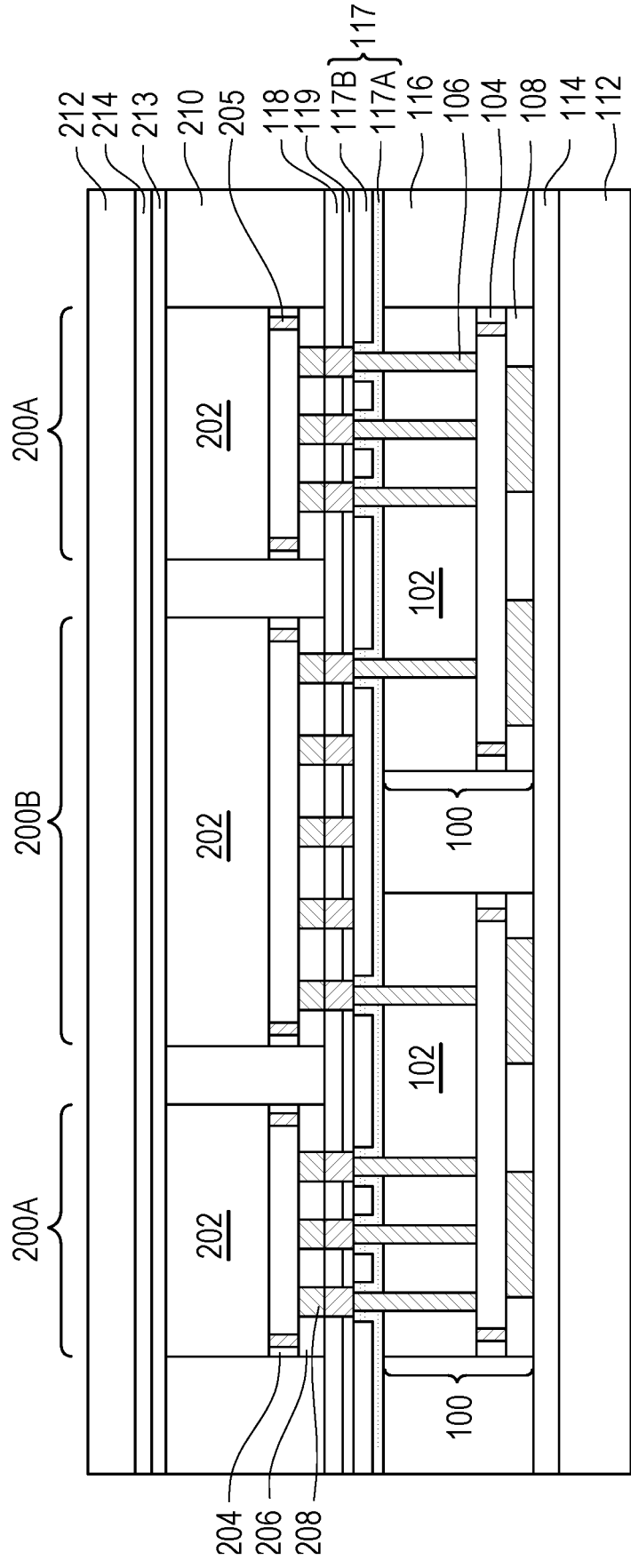

In FIG. 9, a carrier 212 is bonded to the top surfaces of the semiconductor substrates 202 and the upper gap-fill layer 210. The carrier 212 may be a semiconductor carrier, a glass carrier, a ceramic carrier, or the like. The carrier 212 may be a wafer having the same or similar size as the carrier 112. In some embodiments, the carrier 212 is bonded to the semiconductor substrates 202 and the upper gap-fill layer 210 using bonding layers 213 and 214. The bonding layer 213 is formed on the semiconductor substrates 202 and the upper gap-fill layer 210, and the bonding layer 214 is formed on the carrier 212. The bonding layer 213 and the bonding layer 214 may each comprise a dielectric material, such as silicon dioxide or the like, and may be formed by a suitable deposition process such as CVD, ALD, or the like. The structure over the carrier 112 may be bonded to the carrier 212 by bonding the bonding layer 213 and the bonding layer 214 by the same or similar process used for bonding the bonding layer 118 and the bonding layer 206 described with respect to FIG. 7.

Figure 10:
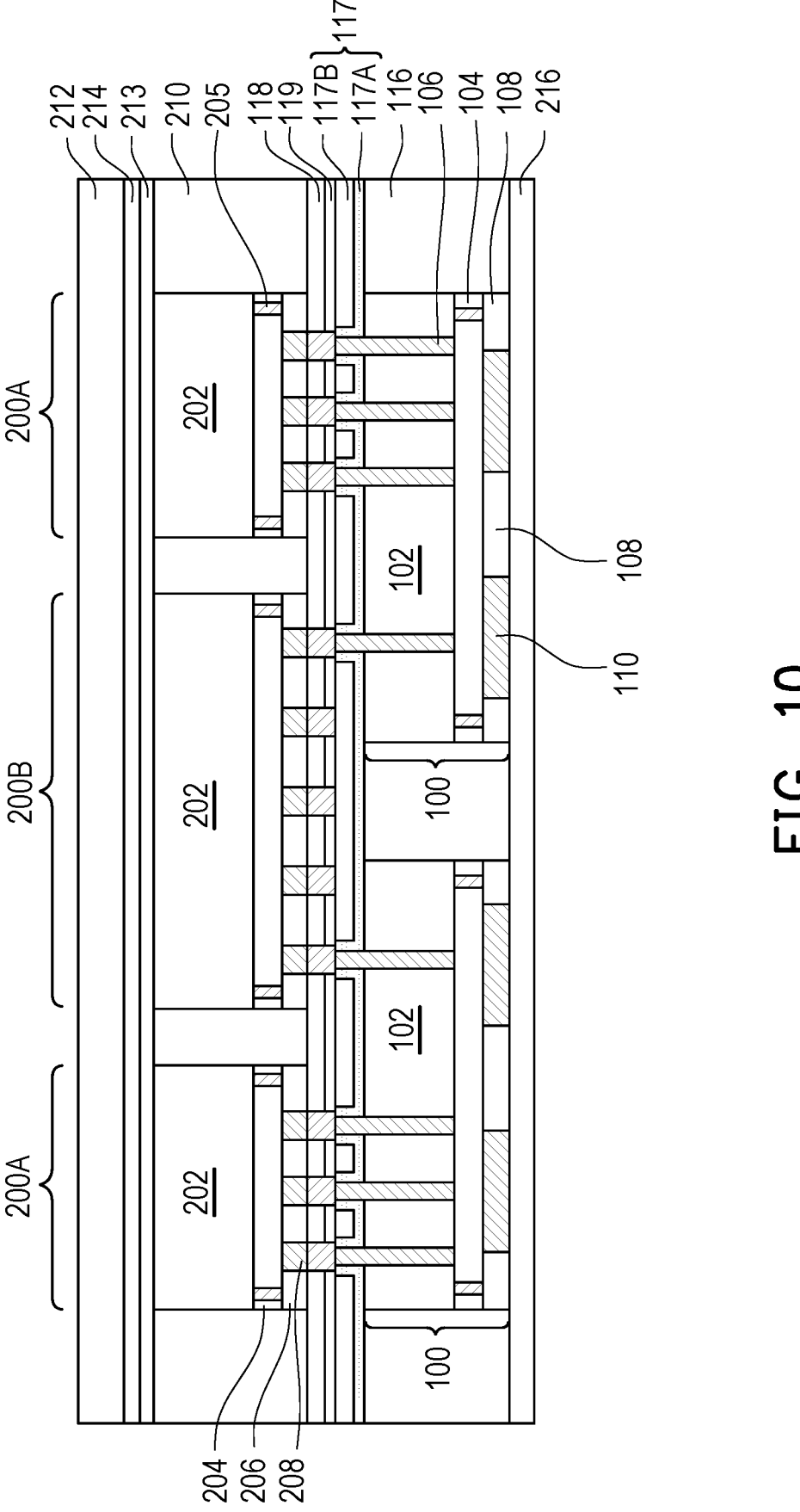

In FIG. 10, the carrier 112 and the adhesive 114 is removed, and a dielectric layer 216 is formed on the lower gap-fill layer 116 and the front sides of the lower integrated circuit dies 100. The removal process may include projecting a light beam such as a laser beam or a UV light beam on the adhesive 114 (shown in FIG. 6) so that the adhesive 114 decomposes upon exposure to the light beam and the carrier 112 may be removed. In some embodiments, the dielectric layer 216 comprises PBO, polyimide, a BCB-based polymer, or the like, and is formed by a suitable coating process such as spin coating, lamination, or the like. In some embodiments, the dielectric layer 216 comprises silicon dioxide, silicon nitride, or the like, and is formed by a suitable deposition process such as CVD, ALD, or the like. In some embodiments, a redistribution structure (not separately illustrated) may be formed prior to forming the dielectric layer 216 to provide additional routing.

Figure 11:
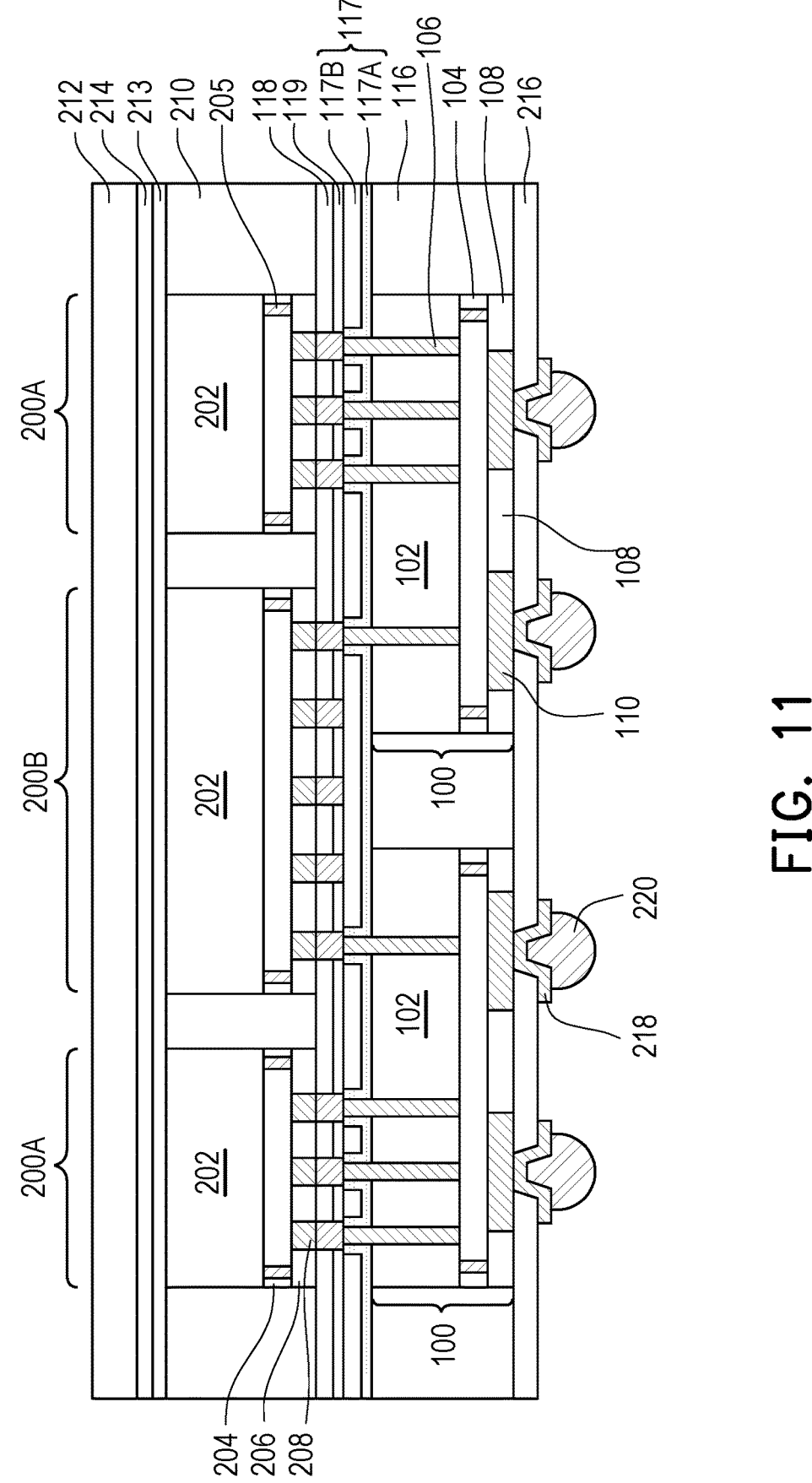

In FIG. 11, under-bump metallizations (UBMs) 218 and electrical connectors 220 are formed. The UBMs 218 may have portions extending along a surface of the dielectric layer 216 and portions extending through the dielectric layer 216 to physically and electrically couple to the bonding pads 110 and the bonding pads 110. As a result, the UBMs 218 are electrically coupled to the lower integrated circuit dies 100.

As an example to form the UBMs 218, the dielectric layer 216 may be patterned to form openings exposing the underlying bonding pads 110 and bonding pads 110. The patterning may be done by an acceptable photolithography and etching processes, such as forming a mask then performing an anisotropic etching. The mask may be removed after the patterning. A seed layer (not separately illustrated) may be formed on the dielectric layer 216, in the openings through the dielectric layer 216, and on the exposed portions of the bonding pads 110 and the bonding pads 110. The seed layer may be a metal layer, which may be a single layer or a composite layer comprising a plurality of sub-layers formed of different materials. In some embodiments, the seed layer comprises a titanium layer and a copper layer over the titanium layer. The seed layer may be formed using a suitable deposition process, such as physical vapor deposition (PVD) or the like. A photoresist may be then formed and patterned on the seed layer. The photoresist may be formed by spin coating or the like and may be exposed to light for patterning. The pattern of the photoresist may correspond to the UBMs 218. The patterning may form openings through the photoresist to expose the seed layer.

A conductive material may be formed in the openings of the photoresist and on the exposed portions of the seed layer. The conductive material may be formed by plating, such as electroless plating, electroplating, or the like. The conductive material may comprise a metal or a metal alloy, such as copper, titanium, tungsten, aluminum, the like, or combinations thereof. Then the photoresist and portions of the seed layer on which the conductive material is not formed may be removed. The photoresist may be removed by an acceptable ashing or stripping process, such as using an oxygen plasma or the like. Once the photoresist is removed, portions of the seed layer on which the conductive material is not formed may be removed by an acceptable etching process, such as by wet or dry etching. The remaining portions of the seed layer and conductive material may form the UBMs 218.

Electrical connectors 220 may be formed on the UBMs 218. The electrical connectors 220 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. In some embodiments, the electrical connectors 220 comprise a conductive material such as solder, copper, aluminum, gold, nickel, silver, palladium, tin, the like, or a combination thereof. The electrical connectors 220 may be formed by initially forming a layer of solder through evaporation, electroplating, printing, solder transfer, ball placement, or the like. Once the layer of solder has been formed on the structure, a reflow may be performed to shape the solder into the desired bump shapes. In some embodiments, the electrical connectors 220 comprise metal pillars, such as a copper pillar, formed by a sputtering, printing, electroplating, electroless plating, CVD, or the like, which are solder free and have substantially vertical sidewalls. A metal cap layer may be formed on top of the metal pillars. The metal cap layer may include nickel, tin, tin-lead, gold, silver, palladium, indium, nickel-palladium-gold, nickel-gold, the like, or a combination thereof, and may be formed by a plating process. The structure shown in FIG. 8 may be referred to as a wafer structure 250.

Figure 12:
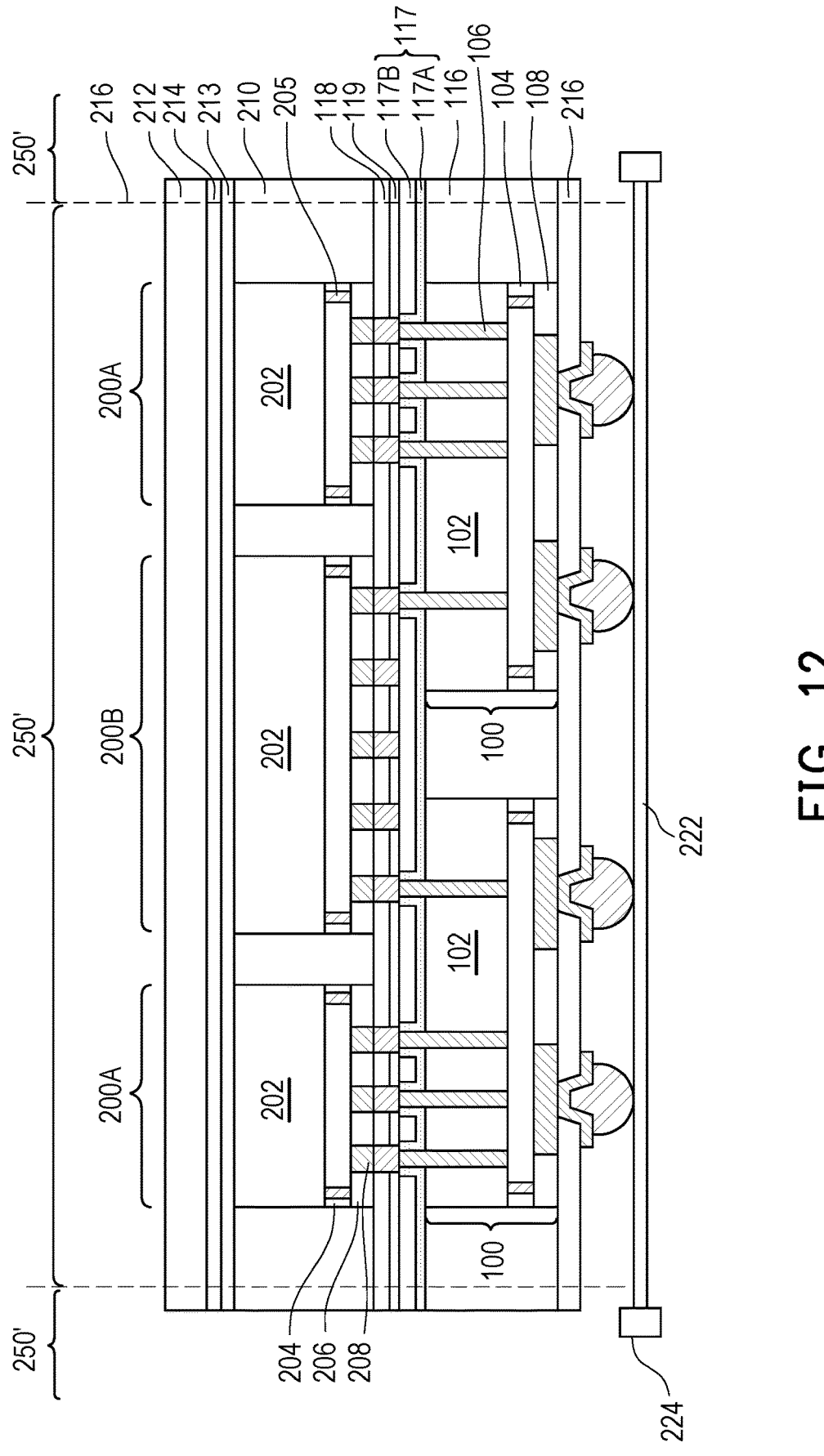

In FIG. 12, the wafer structure 250 is singulated to form individual integrated circuit package components 250'. The processes discussed above may be performed using wafer-level processing. The carrier 212 may be a wafer and may include many structures (not separately illustrated) similar to the one illustrated in FIG. 8. The wafer structure 250 may be placed on a tape 222 supported by a frame 224. The wafer structure 250 may be then singulated along scribe lines 226, so that the wafer structure 250 may be separated into discrete integrated circuit package components 250'. The singulation process may include a sawing process, a laser cutting process, or the like. A cleaning process or rinsing process may be performed after the singulation process.

Figure 13:
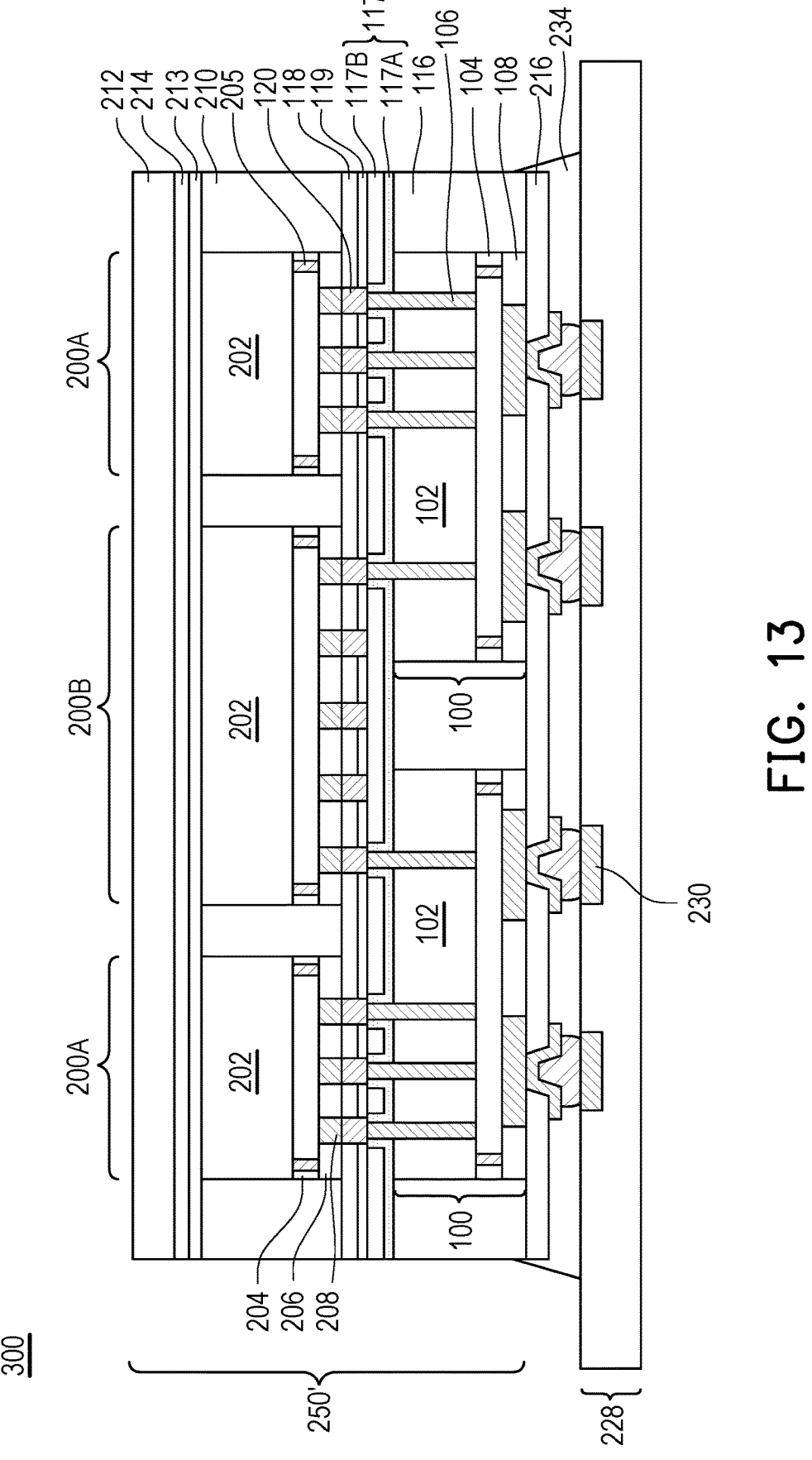

In FIG. 13, the integrated circuit package component 250' is bonded to a package substrate 228 and an underfill 234 is formed between the integrated circuit package component 250' and the package substrate 228. The package substrate 228 may comprise conductive pads 230. In some embodiments, the package substrate 228 comprise materials such as fiberglass reinforced resin, bismaleimide-triazine (BT) resin, other printed circuit board (PCB) materials, or the like. In some embodiments, the package substrate 228 comprise materials such as silicon, germanium, silicon germanium, silicon carbide, gallium arsenic, indium arsenide, indium phosphide, silicon germanium carbide, gallium arsenic phosphide, gallium indium phosphide, or the like.

The package substrate 228 may include active and passive devices (not separately illustrated), such as transistors, capacitors, resistors, combinations thereof, or the like. The devices may be formed using any suitable methods. The package substrate 228 may comprise metallization layers and vias (not separately illustrated) physically and electrically coupled to the conductive pads 230. The metallization layers may be formed over the active and passive devices and may connect the various devices to form functional circuitry. The metallization layers may be alternating layers of dielectric material (e.g., low-k dielectric material) and conductive material (e.g., copper) with vias interconnecting the layers of conductive material. In some embodiments, the package substrate 228 is free of active and passive devices.

During the bonding process the electrical connectors 220 may be reflowed to bond the integrated circuit package component 250' to the conductive pads 230. The electrical connectors 220 may electrically and physically couple the package substrate 228 to the integrated circuit package component 250'. In some embodiments, a solder resist (not separately illustrated) is formed on the package substrate 228. The electrical connectors 220 may be disposed in openings in the solder resist to electrically and physically couple to the conductive pads 230. The solder resist may be used to protect areas of the package substrate 228 from external damage.

The underfill 234 may surround the electrical connectors 220 and protect the joints resulting from the reflowing of the electrical connectors 220. The underfill 234 may encircle the integrated circuit package component 250' in the top-down view. The underfill 234 may be formed by a capillary flow process after the integrated circuit package component 250' is attached or by a suitable deposition method before the integrated circuit package component 250' is attached. The underfill 234 may be subsequently cured. The structure shown in FIG. 10 may be referred to as an integrated circuit package 300.

Figure 14A:
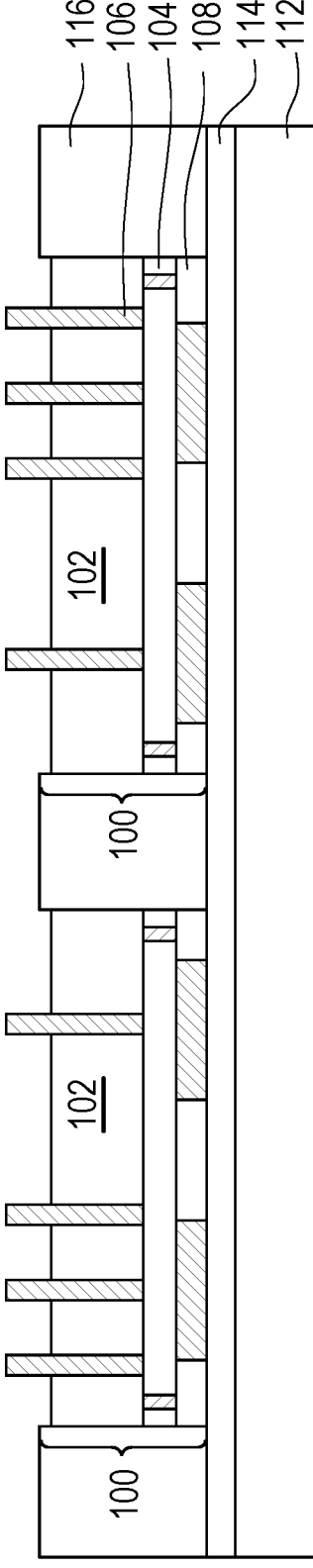
Figure 14B:
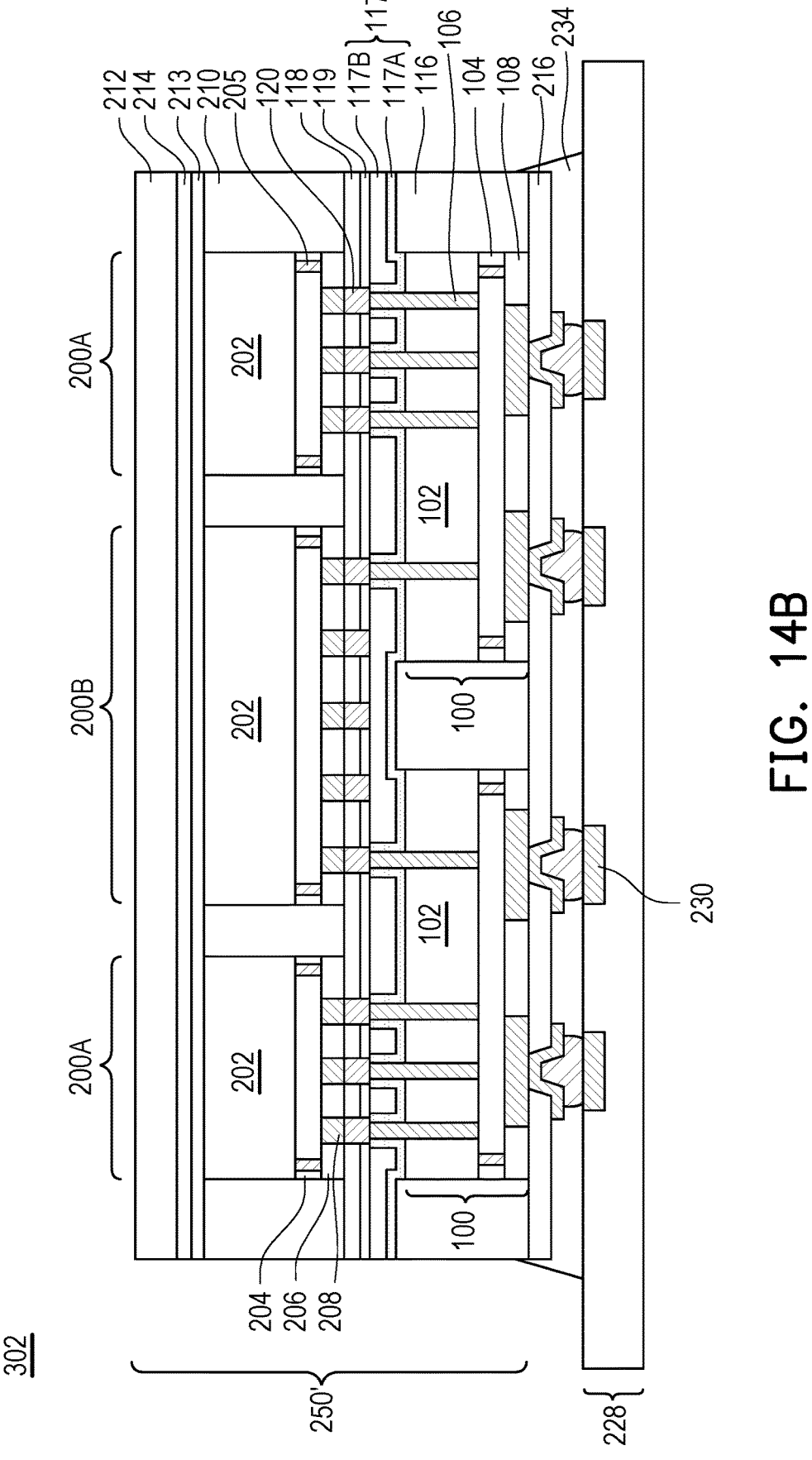

FIGS. 14A and 14B illustrate embodiments in which the semiconductor substrates 102 is recessed below the top surfaces of the lower gap-fill layer 116. FIGS. 14A and 14B illustrate a step performed after the processes discussed above with reference to FIGS. 1 and 2. FIG. 14A shows a structure similar to the one shown in FIG. 3, in accordance with some embodiments, wherein like features refer to like features formed by like processes. In FIG. 14A, portions of the semiconductor substrates 102 and the lower gap-fill layer 116 are further removed to expose sidewalls of the conductive vias 106. The removal rate of the semiconductor substrates 102 may be higher than the removal rate of the lower gap-fill layer 116, and after the removal process, the top surfaces of the semiconductor substrates 102 may be below the top surfaces of the lower gap-fill layer 116, and the sidewalls of the lower gap-fill layer 116 may be exposed.

FIG. 14B shows an integrated circuit package 302, which is similar to the integrated circuit package 300 shown in FIG. 13, in accordance with some embodiments, wherein like features refer to like features formed by like processes. The integrated circuit package 302 may correspond to a structure obtained based on the embodiments illustrated in FIG. 14A after the processes described with respect to FIGS. 4-13 are performed. In FIG. 14B, the isolation layer 117 may overlap the interfaces between the lower integrated circuit dies 100 (including the semiconductor substrates 102) and the lower gap-fill layer 116, such as the sidewalls of the semiconductor substrates 102 and the sidewalls of the lower gap-fill layer 116. The isolation layer 117 may extend on the sidewalls of the lower gap-fill layer 116. Bottom surfaces of the isolation layer 117 may be below the top surfaces of the lower gap-fill layer 116.

Figure 15A:
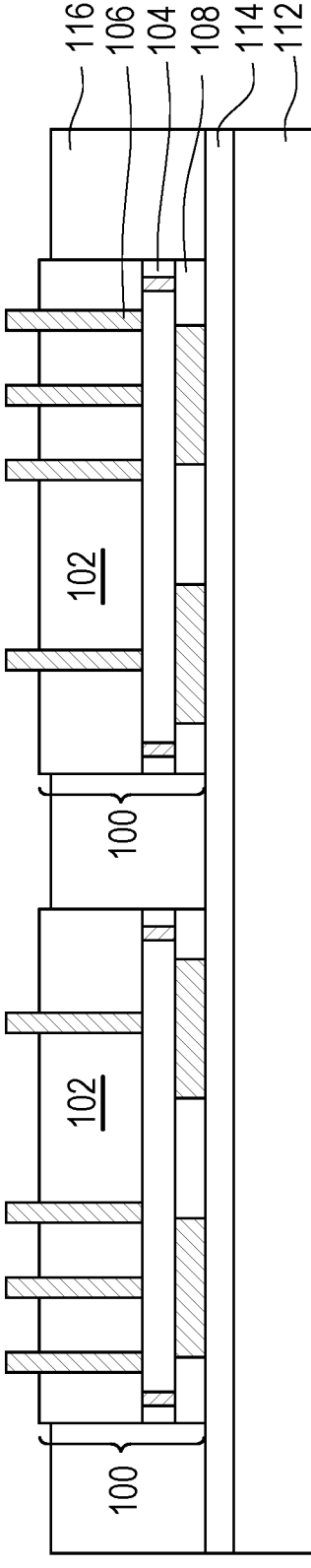
Figure 15B:
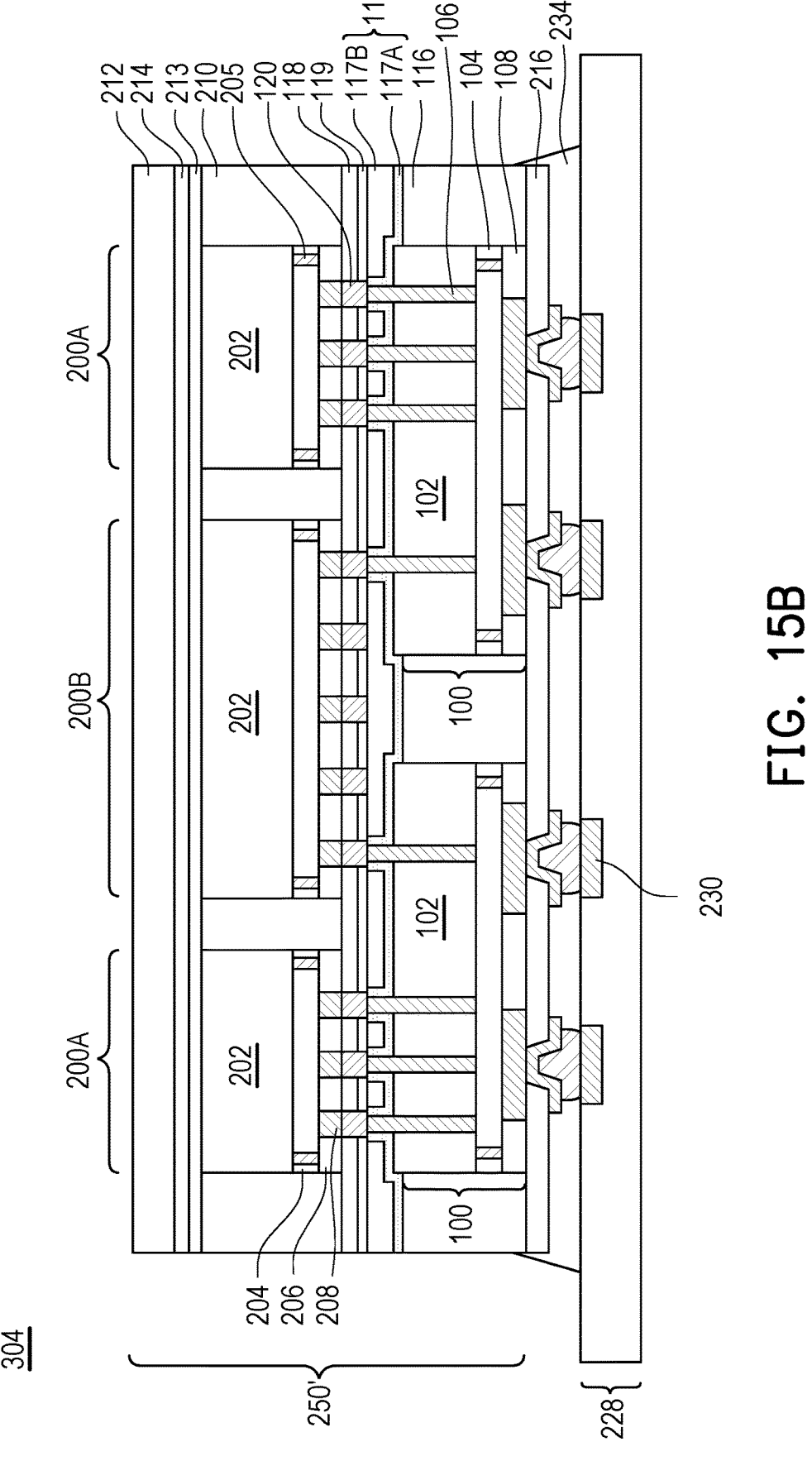

FIGS. 15A and 15B illustrate embodiments in which the lower gap-fill layer 116 is recessed below the top surfaces of the semiconductor substrates 102. FIGS. 15A and 15B illustrate a step performed after the processes discussed above with reference to FIGS. 1 and 2. FIG. 15A shows a structure similar to the one shown in FIG. 3, in accordance with some embodiments, wherein like features refer to like features formed by like processes. In FIG. 15A, portions of the semiconductor substrates 102 and the lower gap-fill layer 116 are further removed to expose sidewalls of the conductive vias 106. The removal rate of the semiconductor substrates 102 may be lower than the removal rate of the lower gap-fill layer 116, and after the removal process, the top surfaces of the lower gap-fill layer 116 may be below the top surfaces of the semiconductor substrates 102, and the sidewalls of the semiconductor substrates 102 may be exposed.

FIG. 15B shows an integrated circuit package 304, which is similar to the integrated circuit package 300 shown in FIG. 13, in accordance with some embodiments, wherein like features refer to like features formed by like processes. The integrated circuit package 304 may correspond to a structure obtained based on the embodiments illustrated in FIG. 15A after the processes described with respect to FIGS. 4-13 are performed. In FIG. 15B, the isolation layer 117 may overlap the interfaces between the lower integrated circuit dies 100 (including the semiconductor substrates 102) and the lower gap-fill layer 116, such as the sidewalls of the semiconductor substrates 102 and the sidewalls of the lower gap-fill layer 116. The isolation layer 117 may extend on the sidewalls of the semiconductor substrates 102. Bottom surfaces of the isolation layer 117 may be below the top surfaces of the semiconductor substrates 102.

Various embodiments are described above in the context of a system on integrated chips (SoIC) package configuration. It should be understood that various embodiments may also be adapted to apply to other package configurations, such as integrated fan-out on substrate (InFO), chip on wafer on substrate (CoWoS) or the like.

The embodiments may have some advantageous features. By forming the isolation layer 117 directly over the interfaces between the lower integrated circuit dies 100 and the lower gap-fill layer 116, the effect of the CTE mismatch between components of the lower integrated circuit dies 100 (e.g., the semiconductor substrates 102) and the lower gap-fill layer 116 on the bonding integrity between the upper integrated circuit dies 200 and the bonding layer 118 as well as the bonding pads 120 may be eliminated or reduced, thereby eliminating or reducing the risk of the delamination of the upper integrated circuit dies 200 during the manufacturing and the operation of the integrated circuit packages 300, 302, and 304. As a result, better reliability of the integrated circuit packages 300, 302, and 304.

In an embodiment, an integrated circuit package includes a first die, wherein the first die includes a first substrate and a first through via extending through the first substrate; a first gap-fill layer along a sidewall of the first substrate; an isolation layer on a surface of the first substrate and a surface of the first gap-fill layer, wherein the isolation layer overlaps an interface between the sidewall of the first substrate and a sidewall of the first gap-fill layer, and wherein the isolation layer extends on sidewalls of the first through via; a first bonding layer over the isolation layer; and a first bonding pad in the first bonding layer. In an embodiment, the first bonding pad is directly over the first gap-fill layer, and wherein the first bonding pad is separated from the first gap-fill layer by the isolation layer. In an embodiment, the first bonding pad is in contact with the isolation layer, and wherein the first bonding pad is electrically isolated from circuitry. In an embodiment, the integrated circuit package further includes a second bonding pad in the first bonding layer, wherein the second bonding pad is in contact with the first through via, and wherein the second bonding pad is electrically coupled to circuitry. In an embodiment, the isolation layer is between the second bonding pad and the first substrate. In an embodiment, the isolation layer includes two sublayers of different materials. In an embodiment, the integrated circuit package further includes an etch stop layer between the first bonding layer and the isolation layer, wherein the first bonding pad extends through the etch stop layer. In an embodiment, the integrated circuit package further includes a second die bonded to the first bonding layer and the first bonding pad, wherein the second die overlaps the interface between the sidewall of the first substrate and the sidewall of the first gap-fill layer.

In an embodiment, an integrated circuit package includes a first die, wherein the first die includes a first substrate and a first through via protruding from a top surface of the first substrate; a first gap-fill layer around the first die, wherein a coefficient of thermal expansion of the first gap-fill layer is different from a coefficient of thermal expansion of the first substrate; an isolation layer in contact with the top surface of the first substrate and a top surface of the first gap-fill layer, wherein the isolation layer overlaps an interface between the first substrate and the first gap-fill layer, and wherein the first through via extends through the isolation layer; a first bonding layer on the isolation layer; a first bonding pad in the first bonding layer; and a second die, wherein the second die includes a second bonding layer and a second bonding pad in the second bonding layer, wherein the second bonding layer is bonded to the first bonding layer, and wherein the second bonding pad is bonded to the first bonding pad. In an embodiment, the top surface of the first substrate and the top surface of the first gap-fill layer are level. In an embodiment, the top surface of the first substrate is below the top surface of the first gap-fill layer. In an embodiment, the top surface of the first substrate is above the top surface of the first gap-fill layer. In an embodiment, the first bonding pad is separated from the first gap-fill layer by the isolation layer, and wherein the first bonding pad is a dummy bonding pad.

In an embodiment, a method of forming an integrated circuit package includes attaching a first die to a carrier, wherein the first die includes a first substrate and a first through via in the first substrate; forming a first gap-fill layer on sidewalls of the first die, wherein the first gap-fill layer includes a dielectric material; removing a portion of the first gap-fill layer and a portion of the first substrate to expose the first through via; forming an isolation layer on the first substrate and the first gap-fill layer, wherein the isolation layer overlaps an interface between the first substrate and the first gap-fill layer, and wherein the first through via extends into the isolation layer; forming a first bonding layer over the isolation layer; and forming a first bonding pad in the first bonding layer, wherein the first bonding pad is in contact with the first through via. In an embodiment, forming the isolation layer includes forming a first isolation sublayer on the first substrate and the first gap-fill layer, and forming a second isolation sublayer on the first isolation sublayer, and wherein the first isolation sublayer and the second isolation sublayer include different materials. In an embodiment, a top surface of the isolation layer and a top surface of the first through via are level. In an embodiment, the isolation layer includes a silicon nitride layer. In an embodiment, the method further includes forming an etch stop layer on the isolation layer before forming the first bonding layer, wherein the first bonding pad extends through the etch stop layer. In an embodiment, the method further includes forming a second bonding pad in the first bonding layer, wherein the second bonding pad is directly over the first gap-fill layer, and wherein a bottom surface of the second bonding pad is covered by the isolation layer. In an embodiment, the method further includes bonding a second die to the first bonding layer, the first bonding pad, and the second bonding pad using dielectric-to-dielectric bonding and metal-to-metal bonding.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. An integrated circuit package, comprising:
a first die, wherein the first die comprises a first substrate and a first through via extending through the first substrate;
a first gap-fill layer along a sidewall of the first substrate;
an isolation layer on a surface of the first substrate and a surface of the first gap-fill layer, wherein the isolation layer overlaps an interface between the sidewall of the first substrate and a sidewall of the first gap-fill layer, and wherein the isolation layer extends on sidewalls of the first through via;
a first bonding layer over the isolation layer; and
a first bonding pad in the first bonding layer.
2. The integrated circuit package of claim 1, wherein the first bonding pad is directly over the first gap-fill layer, and wherein the first bonding pad is separated from the first gap-fill layer by the isolation layer.
3. The integrated circuit package of claim 1, wherein the first bonding pad is in contact with the isolation layer, and wherein the first bonding pad is electrically isolated from circuitry.
4. The integrated circuit package of claim 1, further comprising a second bonding pad in the first bonding layer, wherein the second bonding pad is in contact with the first through via, and wherein the second bonding pad is electrically coupled to circuitry.
5. The integrated circuit package of claim 4, wherein the isolation layer is between the second bonding pad and the first substrate.
6. The integrated circuit package of claim 1, wherein the isolation layer comprises two sublayers of different materials.
7. The integrated circuit package of claim 1, further comprising an etch stop layer between the first bonding layer and the isolation layer, wherein the first bonding pad extends through the etch stop layer.
8. The integrated circuit package of claim 1, further comprising a second die bonded to the first bonding layer and the first bonding pad, wherein the second die overlaps the interface between the sidewall of the first substrate and the sidewall of the first gap-fill layer.

9. An integrated circuit package, comprising:

a first die, wherein the first die comprises a first substrate and a first through via protruding from a top surface of the first substrate;

a first gap-fill layer around the first die, wherein a coefficient of thermal expansion of the first gap-fill layer is different from a coefficient of thermal expansion of the first substrate;

an isolation layer in contact with the top surface of the first substrate and a top surface of the first gap-fill layer, wherein the isolation layer overlaps an interface between the first substrate and the first gap-fill layer, and wherein the first through via extends through the isolation layer;

a first bonding layer on the isolation layer;

a first bonding pad in the first bonding layer; and a second die, wherein the second die comprises a second bonding layer and a second bonding pad in the second bonding layer, wherein the second bonding layer is bonded to the first bonding layer, and wherein the second bonding pad is bonded to the first bonding pad.

10. The integrated circuit package of claim 9, wherein the top surface of the first substrate and the top surface of the first gap-fill layer are level.

11. The integrated circuit package of claim 9, wherein the top surface of the first substrate is below the top surface of the first gap-fill layer.

12. The integrated circuit package of claim 9, wherein the top surface of the first substrate is above the top surface of the first gap-fill layer.

13. The integrated circuit package of claim 9, wherein the first bonding pad is separated from the first gap-fill layer by the isolation layer, and wherein the first bonding pad is a dummy bonding pad.

14. A method of forming an integrated circuit package, the method comprising:

attaching a first die to a carrier, wherein the first die comprises a first substrate and a first through via in the first substrate;

forming a first gap-fill layer on sidewalls of the first die, wherein the first gap-fill layer comprises a dielectric material;

removing a portion of the first gap-fill layer and a portion of the first substrate to expose the first through via;

forming an isolation layer on the first substrate and the first gap-fill layer, wherein the isolation layer overlaps an interface between the first substrate and the first gap-fill layer, and wherein the first through via extends into the isolation layer;

forming a first bonding layer over the isolation layer; and forming a first bonding pad in the first bonding layer, wherein the first bonding pad is in contact with the first through via.

15. The method of claim 14, wherein forming the isolation layer comprises forming a first isolation sublayer on the first substrate and the first gap-fill layer, and forming a second isolation sublayer on the first isolation sublayer, and wherein the first isolation sublayer and the second isolation sublayer comprise different materials.

16. The method of claim 14, wherein a top surface of the isolation layer and a top surface of the first through via are level.

17. The method of claim 14, wherein the isolation layer comprises a silicon nitride layer.

18. The method of claim 14, further comprising forming an etch stop layer on the isolation layer before forming the first bonding layer, wherein the first bonding pad extends through the etch stop layer.

19. The method of claim 14, further comprising forming a second bonding pad in the first bonding layer, wherein the second bonding pad is directly over the first gap-fill layer, and wherein a bottom surface of the second bonding pad is covered by the isolation layer.

20. The method of claim 19, further comprising bonding a second die to the first bonding layer, the first bonding pad, and the second bonding pad using dielectric-to-dielectric bonding and metal-to-metal bonding.

* * * * *